United States Patent
Ookawa

(10) Patent No.: US 6,483,307 B2
(45) Date of Patent: Nov. 19, 2002

(54) MRI USING VARIABLE RATIO OF PRE-PULSES TO FLIP PULSES

(75) Inventor: Masashi Ookawa, Otawara (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/739,334

(22) Filed: Dec. 19, 2000

(65) Prior Publication Data

US 2001/0004211 A1 Jun. 21, 2001

(30) Foreign Application Priority Data

Dec. 20, 1999 (JP) .......................................... 11-361298

(51) Int. Cl.$^7$ ................................................ G01V 3/00
(52) U.S. Cl. ...................................... 324/309; 324/307
(58) Field of Search ................................ 324/309, 307, 324/312, 314

(56) References Cited

U.S. PATENT DOCUMENTS

| 5,034,694 A | * | 7/1991 | Sattin et al. | 324/309 |
|---|---|---|---|---|
| 5,070,299 A | * | 12/1991 | Kiefer et al. | 324/309 |
| 5,079,504 A | * | 1/1992 | Machida | 324/309 |
| 5,099,207 A | * | 3/1992 | Luyten | 324/309 |
| 5,117,187 A | * | 5/1992 | Granot | 324/309 |
| 5,124,650 A | * | 6/1992 | Granot | 324/309 |
| 5,243,283 A | * | 9/1993 | Tokunaga et al. | 324/306 |
| 5,361,028 A | * | 11/1994 | Kanayama et al. | 324/309 |
| 5,495,172 A | * | 2/1996 | Hayakawa | 324/318 |
| 5,633,586 A | | 5/1997 | Finn | |
| 5,842,989 A | * | 12/1998 | Zur | 324/306 |
| 6,043,655 A | * | 3/2000 | Makita et al. | 324/307 |
| 6,046,588 A | * | 4/2000 | Watanabe | 324/307 |
| 6,078,175 A | * | 6/2000 | Foo | 324/300 |
| 6,275,038 B1 | * | 8/2001 | Harvey | 324/309 |

FOREIGN PATENT DOCUMENTS

| EP | 0 637 756 A1 | * | 4/1995 |
|---|---|---|---|
| JP | 11-104106 | | 4/1999 |

* cited by examiner

Primary Examiner—Edward Lefkowitz
Assistant Examiner—Dixomara Vargas
(74) Attorney, Agent, or Firm—Nixon & Vanderhye P.C.

(57) ABSTRACT

A magnetic resonance imaging apparatus applies flip-pulses and gradient magnetic field pulses to generate a plurality of MR signals and to add spatial encoding information to the MR signals, applies pre-pulses to obtain a predetermined effect, and generates an image on the basis of the MR signals. The MR signals include first MR signals located in a first region in k-space and second MR signals located in a second region in k-space. The ratio of the number of the pre-pulses to the number of the flip-pulses applied in a unit time for obtaining the first MR signals is made different from the ratio for obtaining the second MR signals.

24 Claims, 5 Drawing Sheets

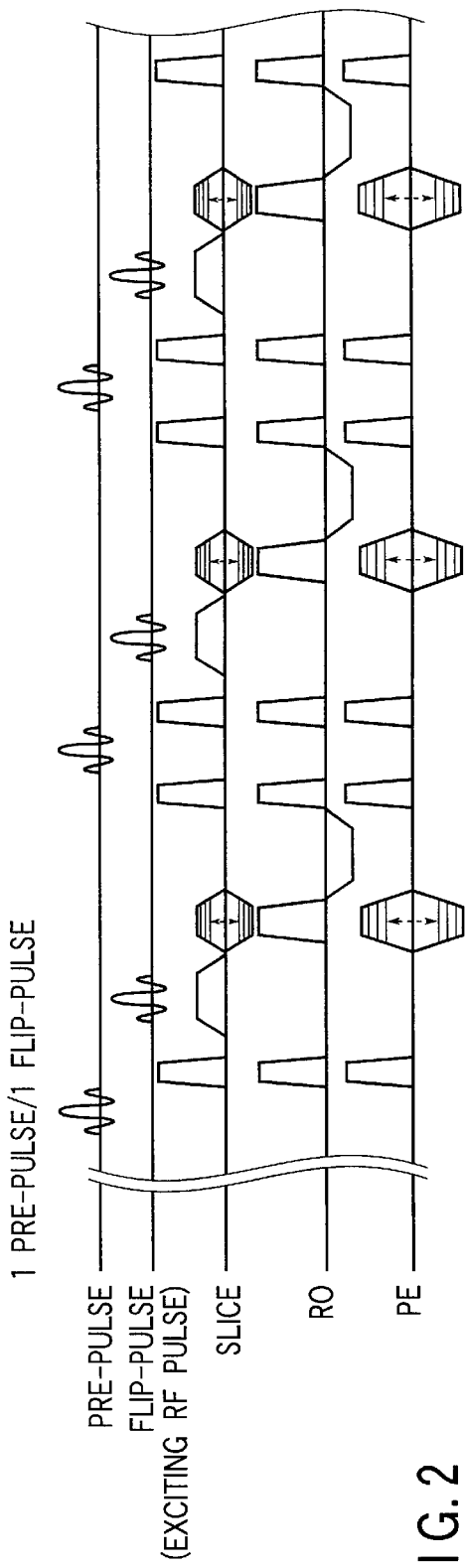
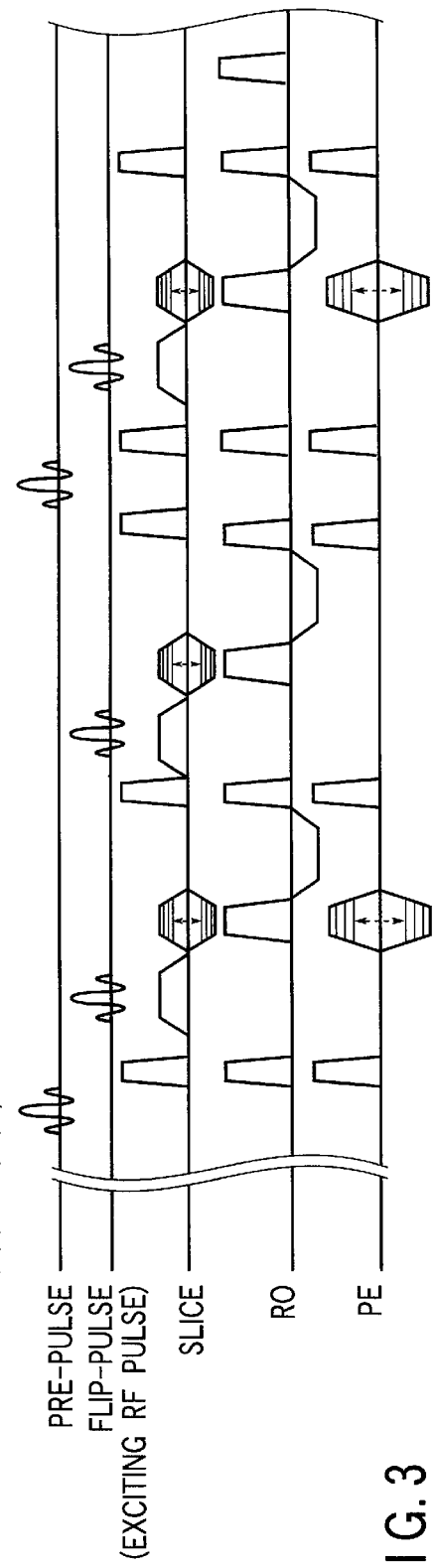

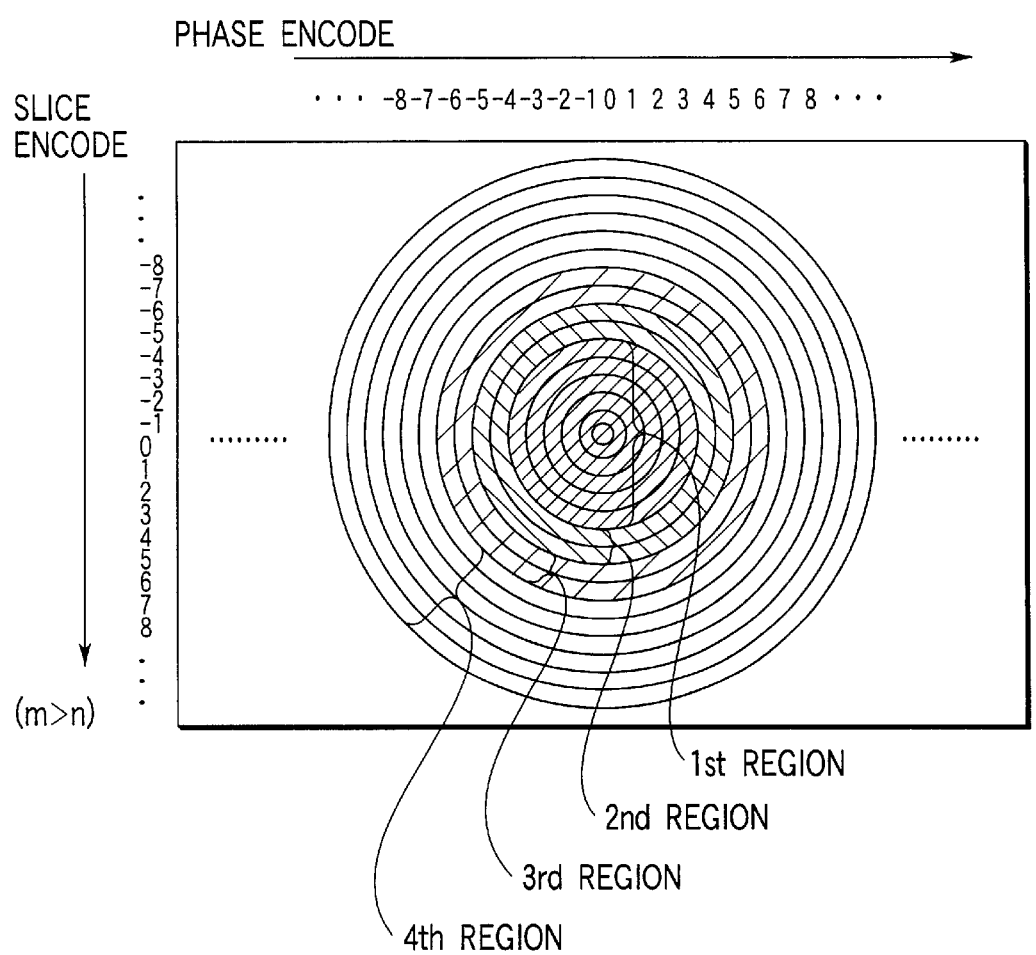
F I G. 6

MRI USING VARIABLE RATIO OF PRE-PULSES TO FLIP PULSES

CROSS-REFERENCE TO RELATED APPLICATIONS

This application is based upon and claims the benefit of priority from the prior Japanese Patent Application No. 11-361298, filed Dec. 20, 1999, the entire contents of which are incorporated herein by reference.

BACKGROUND OF THE INVENTION

The present invention relates to a magnetic resonance diagnostic apparatus and, more particularly, to an improvement in an application method of a pre-pulse such as a fat suppression pulse applied before a flip-pulse (exciting RF pulse) is applied.

A typical fat suppression pulse as a pre-pulse reduces an MR signal (Magnetic Resonance signal) from fat by selectively exciting only fat by a flip-pulse narrowed in band in accordance with a chemical shift between fat and water, and then applying a gradient magnetic field (spoiler pulse) to sufficiently dephase the signal. Recently, the fat suppression pulse is indispensable in improving the image quality particularly in MRA (MR Angiography).

As is well known, according to the MRA principle, a still object such as a brain parenchyma or organ within the photographing region is sequentially excited before the longitudinal magnetization satisfactorily recovers. Thus, the signal level gradually decreases. However, fresh blood (water) always flows into the photographing region, so its signal level hardly decreases in comparison with still objects. As a result, an image (bloodstream image) in which the bloodstream is emphasized relatively to still objects is obtained. This MRA suppresses fat by applying a fat suppression pulse as a pre-pulse immediately before application of a flip-pulse.

To narrow the band of the fat suppression pulse, as described above, the pulse width of the fat suppression pulse must be increased from, e.g., $\pm\pi$ to $\pm 4\cdot\pi$. A very long standby time is required after application of a pre-pulse to application of a flip-pulse. In many cases, the application period (repetition time TR) of the flip-pulse must be set 2 to 3 times that used when no pre-pulse is applied.

The photographing time required to acquire all data necessary for image generation increases several times. This causes various clinical problems: photographing cannot be completed within one breath-holding time, the burden on a patient increases, and the generation of motion artifacts increases.

BRIEF SUMMARY OF THE INVENTION

It is an object of the present invention to greatly shorten the photographing time while ensuring a necessary image contrast in a magnetic resonance diagnostic apparatus using a pre-pulse such as a fat suppression pulse.

A magnetic resonance imaging apparatus applied flip-pulses and gradient magnetic field pulses to generate a plurality of MR signals and to add encoding information to the MR signals, applies pre-pulses to obtain a predetermined effect, and generates an image on the basis of the MR signals. The MR signals include first MR signals arranged in a first region in a k-space and second MR signals arranged in a second region in the k-space. An applying condition for the second MR signals is differed from that for the first MR signals. The applying condition is defined as a ratio of the number of the pre-pulses to the number of the flip-pulses applied in an unit time. The pulse sequence time can be shortened while good image contrast is ensured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a timing chart showing an example of a pulse sequence when one pre-pulse is applied for one flip-pulse in the embodiment;

FIG. 3 is a timing chart showing an example of a pulse sequence when one pre-pulse is applied for two flip-pulses in the embodiment;

FIG. 6 is a view showing changes in the pre-pulse application frequency in the k-space of the 3DFT method in the embodiment.

DETAILED DESCRIPTION OF THE INVENTION

A magnetic resonance imaging apparatus according to an embodiment of the present invention will be described in detail below with reference to the several views of the accompanying drawing.

Figure 1:
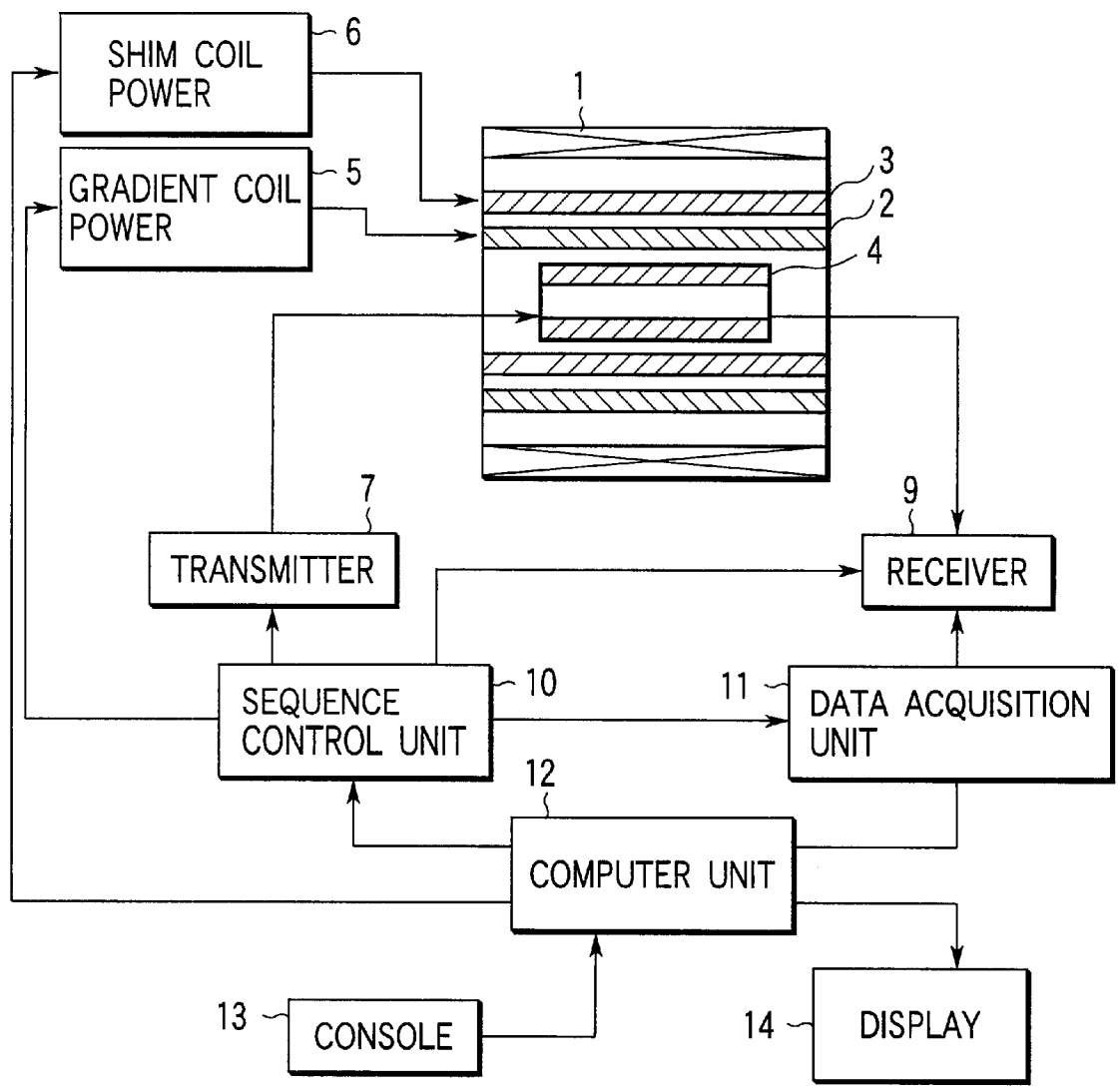
FIG. 1 is a block diagram showing the arrangement of a magnetic resonance imaging apparatus according to an embodiment of the present invention.

FIG. 1 is a block diagram showing the arrangement of a magnetic resonance imaging apparatus according to an embodiment of the present invention. For example, a cylindrical static magnetic field magnet 1 incorporates a shim coil 3 for receiving power from a shim coil power 6 to generate a magnetic field for enhancing the uniformity of a static magnetic field under the control of a computer unit 12, a gradient coil 2 for generating respective gradient magnetic field pulses for three orthogonal axes, and a probe (RF coil) 4 for applying an RF magnetic field pulse (RF pulse) to an object to be examined and receiving an MR signal from the object. Note that the probe 4 may not be for both transmission and reception, but transmission and reception probes may be separately arranged.

A sequence control unit 10 controls in accordance with a predetermined pulse sequence a gradient coil power 5 for applying a gradient magnetic field pulse to an object to be examined via the gradient coil 2, a transmitter 7 for applying an RF magnetic field pulse to the object via the probe 4, and a data acquisition unit 11 for acquiring an MR signal received via the receiver 9. The computer unit 12 functions as the host computer of the whole apparatus, and in addition has an arithmetic function of generating an MR image by a 2DFT (2-Dimensional Fourier Transformation) method or a 3DFT (3-Dimensional Fourier Transformation) method on the basis of MR signals acquired by the data acquisition unit 11. A display 14 displays an MR image generated by the computer unit 12, and various pieces of information.

A pulse sequence executed under the control of the sequence control unit 10 is set to a specific pulse sequence among an SE (Spin Echo) method, FE (Field Echo) method, and EPI (Echo Planar Imaging) method, or arbitrarily selected from them by the operator via a console 13. A pre-pulse such as a fat suppression pulse can be inserted in this pulse sequence, and the pre-pulse application method can be controlled by the sequence control unit 10. The pre-pulse application method is a characteristic feature of the present invention, and will be described in detail. The pre-pulse includes in addition to the fat suppression pulse a pre-saturation pulse, tagging pulse, MTC (Magnetization Transfer Contrast) pulse for visualizing mainly the peripheral blood vessel of a brain parenchyma or the like by light contrast, and IR (Inversion Recovery) pulse. The present invention can be applied to any of the pulses.

FIG. 2 shows a pulse sequence when a spin warp method and 3DFT method are respectively adopted as an MR signal generation technique and visualization technique, and one pre-pulse is applied every time one flip-pulse (exciting RF pulse) is applied. In this case, the applying condition is 1. The applying condition is defined as a ratio of the number of the pre-pulses to the number of the flip-pulses applied in an unit time(one second).

As is well known, the 3DFT method uses a gradient magnetic field (readout gradient magnetic field: RO) along a given axis among three different gradient magnetic field pulses along gradient axes generated by the gradient coil 2 in order to encode the frequency of an MR signal, uses a gradient magnetic field (slice selective gradient magnetic field: SLICE) along another axis in order to select a slice and encode the slice of the MR signal, and uses a gradient magnetic field (phase encoding gradient magnetic field: PE) along the remaining axis in order to encode the phase of the MR signal. Note that the 2DFT method (2-Dimensional Fourier Transformation method) uses the gradient magnetic field (SLICE) not for slice encode but only for slice selection, unlike the 3DFT method.

In the 3DFT method, the flip-pulse is repetitively applied in the period of a repetition time TR while the patterns of slice encode and phase encode are slightly changed. In the case of FIG. 2, one pre-pulse is applied for each flip-pulse.

FIG. 3 shows a pulse sequence when one pre-pulse is applied every time two flip-pulses are applied (the applying condition is 0.5). In this case, a pre-pulse is applied in correspondence with one of a pair of adjacent flip-pulses, but no pre-pulse is applied for the other flip-pulse.

Figure 4:
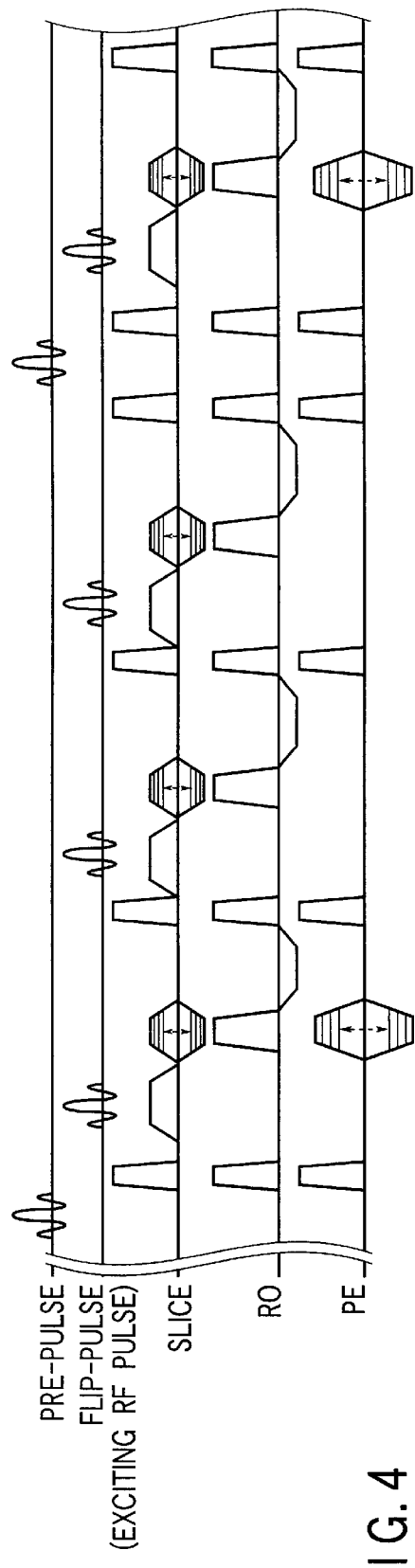
FIG. 4 is a timing chart showing an example of a pulse sequence when one pre-pulse is applied for three flip-pulses in the embodiment.

FIG. 4 shows a pulse sequence when one pre-pulse is applied every time three flip-pulses are applied(the applying condition is ⅓). In this case, a pre-pulse is applied in correspondence with one of three successive flip-pulses, but no pre-pulse is applied for the remaining two flip-pulses.

Figure 5:
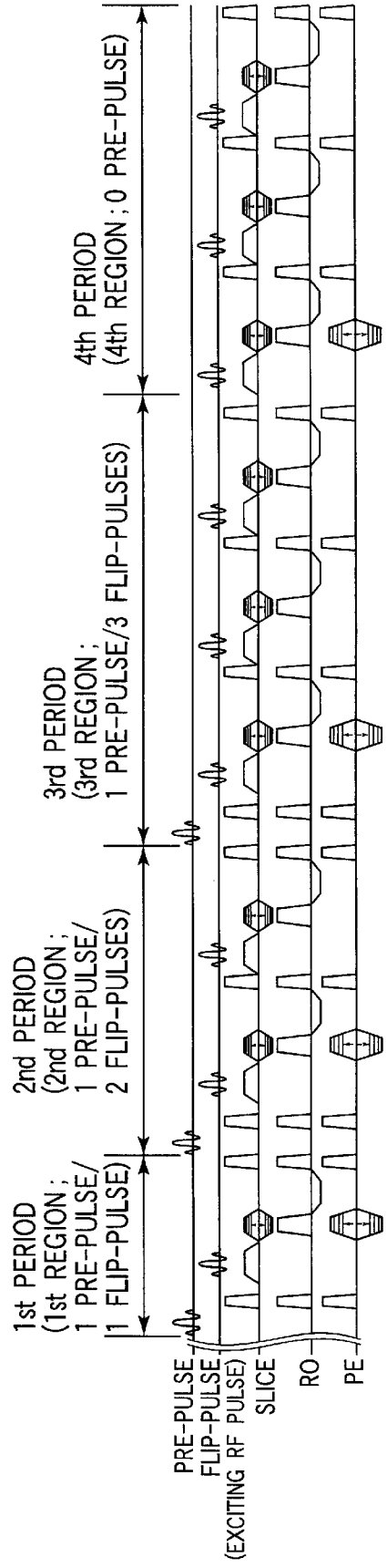
FIG. 5 is a timing chart showing an example of a pulse sequence applied to a 3DFT method in the embodiment.

FIG. 5 shows a 3DFT pulse sequence according to the embodiment. FIG. 6 shows the relationship between a plurality of regions in the k-space and the pre-pulse application frequency of each region. As shown FIG. 2, one pre-pulse is applied for one flip-pulse in a period (first period) in which MR signals in the first region (central region) centered on zero encode in the k-space that most influences the image contrast are acquired.

As shown in FIG. 3, one pre-pulse is applied for two flip-pulses in a period (second period) in which MR signals in the second region around the first region are acquired.

As shown in FIG. 4, one pre-pulse is applied for three flip-pulses in a period (third period) in which MR signals in the third region around the second region are acquired.

No pre-pulse is applied for a flip-pulse in a period (fourth period) in which MR signals in the outermost region (fourth region) around the third region that least influences the image contrast are acquired. In angiography, the contrast immediately after the start of photographing is important. For this reason, application of a pre-pulse and flip-pulse starts after an idle time.

In this way, the pre-pulse application frequency with respect to the flip-pulse, i.e. the applying condition, is slightly decreased outward from zero encode in the k-space, and no pre-pulse is applied in the outermost region, i.e., the pre-pulse application frequency with respect to the flip-pulse is changed every period on the photographing time axis. In other words, the pre-pulse application interval is changed over time on the photographing time axis. This can greatly shorten the photographing time, compared to a case wherein one pre-pulse is applied for one flip-pulse uniformly in all the regions of the k-space. Since the pre-pulse frequency is decreased outward from the central region which most influences the image contrast, a remarkable decrease in image contrast can be suppressed.

Figure 7:
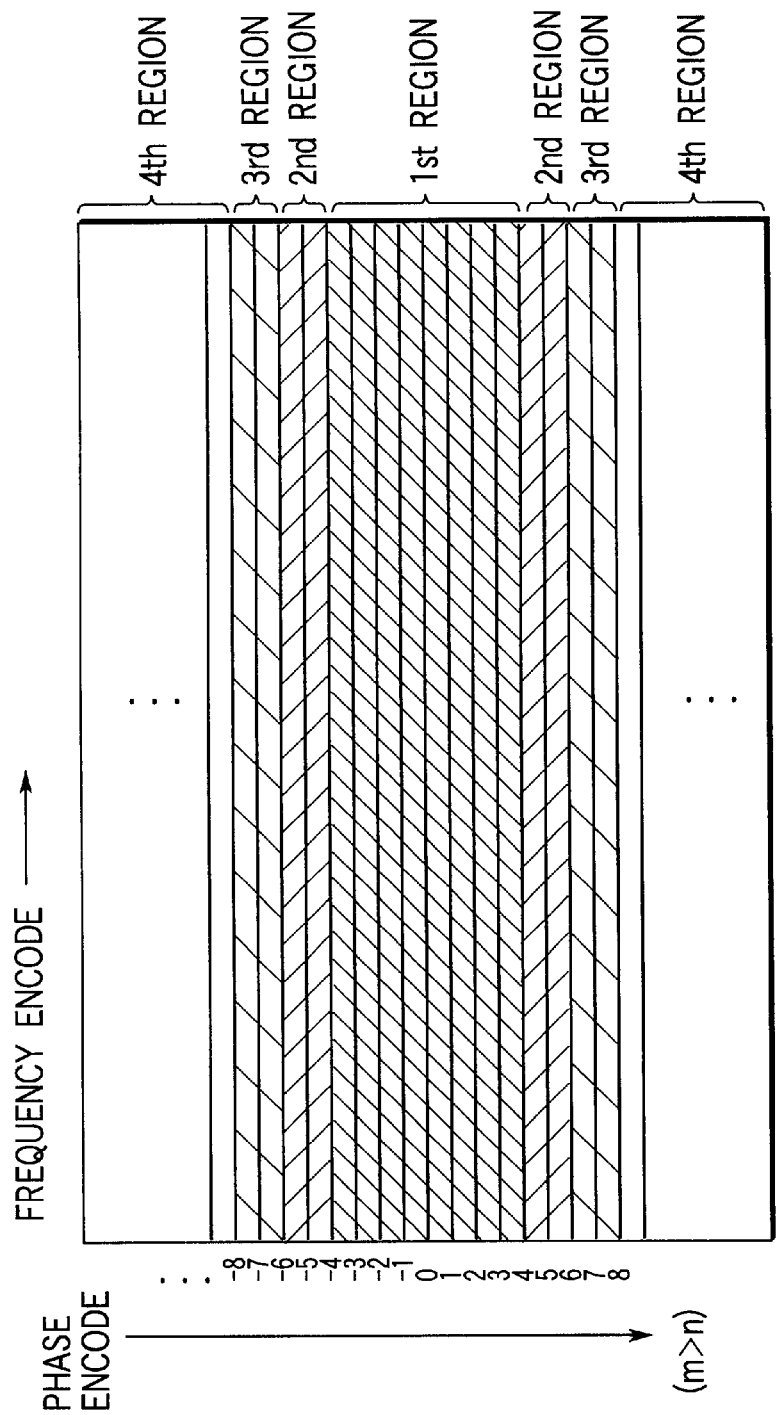
FIG. 7 is a view showing changes in the pre-pulse application frequency in the k-space of a 2DFT method in the embodiment.

As shown in FIG. 7, the present invention can also be applied to the 2DFT method. More specifically, one pre-pulse is applied for one flip-pulse in a period in which MR signals in the central region (first region) of the k-space that most influences the image contrast are acquired. One pre-pulse is applied for two flip-pulses in a period in which MR signals in the intermediate region (second region) are acquired. One pre-pulse is applied for three flip-pulses in a period in which MR signals in the outer region (third region) are acquired. No pre-pulse is applied for a flip-pulse in a period (fourth period) in which MR signals in the outermost region (fourth region) are acquired. Also in the 2DFT method, the pre-pulse application frequency with respect to the flip-pulse is slightly decreased outward from zero encode in the k-space, and no pre-pulse is applied in the outermost region. Accordingly, the 2DFT method can attain the same effects as those of the 3DFT method.

As has been described above, pre-pulses are applied at a high frequency in a region (first region) near zero encode in the k-space that highly influences the image contrast. As the region is farther from zero encode, the application frequency is decreased more. For the whole pulse sequence, the number of applied pre-pulses greatly decreases in comparison with a case wherein one pre-pulse is applied for one flip-pulse at a conventional fixed frequency. Along with the decrease, the photographing time can be greatly shortened. Since the frequency is set high near zero encode, a necessary image contrast can be ensured.

The present invention is not limited to the above-described embodiment, and can be variously modified. For example, in the above description, the pre-pulse frequency with reference to the flip-pulse is decreased to one pre-pulse for one flip-pulse, one pre-pulse for two flip-pulses, and one pre-pulse for three flip-pulses. However, the present invention is not limited to this. The frequency may be decreased stepwise to one pre-pulse for one flip-pulse, one pre-pulse for three flip-pulses, and one pre-pulse for five flip-pulses, or may be changed in various patterns.

A plurality of frequency pattern data may be prepared in the memory of the sequence control unit 10, and may be selectively used in accordance with an instruction from the operator. Further, various patterns can be adopted for the division method of regions using different frequencies in the k-space, i.e., for region boundaries. A plurality of region division pattern data in the k-space may be prepared in the memory of the sequence control unit 10, and may be selectively used in accordance with an instruction from the operator. These frequency patterns and region division patterns can be arbitrarily combined and used to arbitrarily adjust the image contrast and the output of artifacts.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
   means for applying flip-pulses and gradient magnetic field pulses to generate a plurality of MR signals and to add encoding information to the MR signals, applying or not applying pre-pulses to obtain a predetermined effect, and generating an image on the basis of the MR signals,
   wherein the MR signals include first MR signals located in a first region in k-space and second MR signals located in a second region in k-space, and
   means causing an applying condition so that for the second MR signals are different from the first MR signals, the applying conditon being defined as the ratio of the number of pre-pulses to the number of flip-pulses applied in an unit time.

2. An apparatus as in claim 1, wherein:
   the first region includes a region centered on zero encode in k-space, and
   the second region includes a region located outside the first region in k-space.

3. An apparatus as in claim 2, wherein said ratio used for acquiring the first MR signals is higher than said ratio used for acquiring the second MR signals.

4. An apparatus as in claim 1, wherein the second MR signals are generated under the applying condition that no pre-pulse is applied.

5. An apparatus as in claim 2, wherein the first MR signals are generated under the applying condition that said ratio is 1 and the second MR signals are generated under the applying condition that said ratio is equal to or less than 0.5.

6. An apparatus as in claim 2, wherein the MR signals further include third MR signals located in a third region outside the second region in k-space, the first MR signals being generated under the applying condition that said ratio is 1/L, the second MR signals being generated under the applying condition that said ratio is 1/M where M is greater than L, the third MR signals being generated under the applying condition that said ratio is 1/N where N is greater than M.

7. An apparatus as in claim 6, wherein the third MR signals are generated under the applying condition that no pre-pulse is applied.

8. An apparatus as in claim 1, wherein a combination of the applying condition for the first signals and the applying condition for the second signals can be changed.

9. An apparatus as in claim 1, wherein a boundary between the first and second regions in k-space can be changed.

10. An apparatus as in claim 1, wherein the pre-pulse includes a fat suppression pulse, a pre-saturation pulse, an MTC pulse, and an IR pulse.

11. A magnetic resonance imaging apparatus comprising:
    means for applying flip-pulses and gradient magnetic field pulses to generate a plurality of MR signals and to add encoding information to the MR signals, applying or not applying pre-pulses to obtain a predetermined effect, and generating an image on the basis of the MR signals, and
    means for causing an applying condition in a first period on a pulse sequence time axis to be different from that in the second period, the applying condition being defined as the ratio of the number of pre-pulses to the number of flip-pulses applied in a unit time.

12. An apparatus as in claim 11, wherein first MR signals in a first region centered on zero encode in k-space are acquired in the first period, and second MR signals in a second region outside the first region in k-space are acquired in the second period.

13. An apparatus as in claim 12, wherein the applying condition ratio in the first period is higher than that in the second period.

14. An apparatus as in claim 11, wherein no pre-pulse is applied in the second period.

15. An apparatus as in claim 12, wherein the applying condition in the first period is 1, the applying condition in the second period is 0.5 or less than.

16. An apparatus according to claim 12, wherein the applying condition in the first period is 1/L, the applying condition in the second period is 1/M where M is greater than L, and the applying condition in a third period other than the first and second periods is 1/N where N is greater than M.

17. An apparatus as in claim 16, wherein no pre-pulse is applied in a period other than the first, second, and third periods.

18. An apparatus as in claim 11, wherein a combination of the applying condition in the first period and the applying condition in the second period can be changed.

19. An apparatus as in claim 12, wherein a boundary between the first and second regions in k-space can be changed.

20. A magnetic resonance imaging apparatus comprising:
    means for repetitively applying flip-pulses, receiving a plurality of MR signals encoded in accordance with a 2DFT or 3DFT imaging method after the respective flip-pulses are applied, and generating an image on the basis of the MR signals, and
    means for changing an application interval of a pre-pulse between first and second periods on a pulse sequence time axis.

21. A method for performing MRI with an image data acquisition sequence employing at least one RF pre-pulse in association with RF flip pulses used to initiate respectively associated cycles of data acquisition, said method comprising:

during an image data acquisition sequence, varying the number of RF flip pulses that are associated with each RF pre-pulse.

22. A method for performing MRI as in claim 21 wherein, for a portion of the sequence, zero pre-pulses are used in association with RF flip pulses.

23. A method for performing MRI as in claim 21 wherein the ratio of pre-pulses to flip pulses decreases as image data is acquired for respectively corresponding portions of k-space that vary from a central portion to portions situated more remote from the central portion.

24. A method for performing MRI as in claim 21 wherein the ratio of pre-pulses to flip pulses decreases as a function of elapsed time from the start of an image data acquisition sequence.

* * * * *